United States Patent
Ito

(10) Patent No.: US 6,864,639 B2
(45) Date of Patent: Mar. 8, 2005

(54) DISPLAY AND METHOD FOR MANUFACTURING THE SAME

(75) Inventor: Nobuyuki Ito, Tokyo (JP)

(73) Assignee: Dai Nippon Printing Co, Ltd, Tokyo (JP)

( * ) Notice: Subject to any disclaimer, the term of this patent is extended or adjusted under 35 U.S.C. 154(b) by 0 days.

(21) Appl. No.: 10/659,420

(22) Filed: Sep. 10, 2003

(65) Prior Publication Data

US 2004/0080276 A1 Apr. 29, 2004

(30) Foreign Application Priority Data

Sep. 10, 2002 (JP) ........................................ 2002-264555

(51) Int. Cl.[7] ................................................ C09G 3/10
(52) U.S. Cl. ............................. 315/169.3; 315/169.1; 345/76; 345/77; 345/45; 313/498; 313/520
(58) Field of Search ........................... 315/169.3, 169.4, 315/169.1; 345/36, 48, 44–46, 51, 52, 55, 84, 75.2, 76, 77, 92; 313/498, 505, 506, 520, 521; 257/296, 298

(56) References Cited

U.S. PATENT DOCUMENTS

| | | | | |
|---|---|---|---|---|
| 6,215,244 B1 | * | 4/2001 | Kuribayashi et al. | ....... 313/505 |
| 6,633,270 B2 | * | 10/2003 | Hashimoto | ................... 345/76 |
| 6,714,178 B2 | * | 3/2004 | Koyama et al. | ............... 345/76 |
| 6,791,129 B2 | * | 9/2004 | Inukai | ........................ 257/208 |
| 6,806,643 B2 | * | 10/2004 | Hayashi et al. | ............. 313/506 |
| 2001/0007413 A1 | | 7/2001 | Battersby | |
| 2001/0015618 A1 | | 8/2001 | Yamazaki et al. | |

FOREIGN PATENT DOCUMENTS

| | | | |
|---|---|---|---|
| JP | 2002032037 | * | 1/2002 |
| JP | 2002040961 | * | 2/2002 |
| JP | 2002108262 | * | 4/2002 |
| WO | WO03/054844 | | 7/2003 |

\* cited by examiner

*Primary Examiner*—Haissa Philogene
(74) *Attorney, Agent, or Firm*—Timothy J. Keefer; Seyfarth Shaw LLP

(57) ABSTRACT

A display comprising: an electrically insulative substrate; a plural of current driven type light emitting elements arranged, on the electrically insulative substrate, in a matrix form; a scanning line which is disposed at least one piece per each element row; a data line which is disposed at least one piece per one or two element columns; a power source supply line disposed on the electrically insulative substrate; and a switching circuit portion which is disposed at least one piece per at least one current driven type light emitting element.

8 Claims, 7 Drawing Sheets

DISPLAY AND METHOD FOR MANUFACTURING THE SAME

CROSS REFERENCE TO RELATED APPLICATION

This application claims priority of Japanese Patent Application serial No. 2002-264555, filed Sep. 10, 2002.

BACKGROUND OF THE INVENTION

1. Field of the Invention

The present invention relates to a display using a current driven type light emitting element as a pixel, and to a method for manufacturing the same.

2. Description of the Related Art

In recent years, flat panel displays are used in many fields and in many places and, as computerization develops, the importance of them is increasingly enhanced.

While, when we say a representative of the flat panel displays, it is a liquid crystal display (hereinafter referred to simply as "LCD"). As flat panel displays based on a displaying principle that is different from that of the LCD, development of organic electroluminescent (hereinafter the "electroluminescent" is abbreviated as "EL") display, inorganic EL display, plasma display, light emitting diode display, fluorescent display tube, field emitting type display, etc. is also active.

Of the above mentioned displays, the each display other than the LCD are the ones called "spontaneous light emitting type displays" and they greatly differ from the LCD's that are called "light receiving type displays" in respect of the following points (1) to (4).

(1) Power Consumption

The individual pixels in the LCD do not emit any light themselves, and function as light shutters that transmit and shield light. Therefore, the LCD's other than the transmitting type LCD's need backlights. When displaying, regardless of the mode of the displayed information, the backlights are always needed to be on. For this reason, when displaying, power as much as the full displaying state is consumed on steady basis.

In contrast, in the spontaneous light emitting type, the individual pixels themselves emit light. Therefore, there is no need to provide a separate light source and, only certain pixels are needed to be turned on, depending on the mode of the displayed information. Therefore, the spontaneous light emitting type needs less power than the light receiving type displays.

(2) Contrast

In case of the LCD, the individual pixels cut off the light from the backlight or the environmental illumination light to obtain a state of darkness. However, it is difficult to cut off all the light leakage from the individual pixels completely, as a result, improving the contrast is difficult.

In contrast, in the spontaneous light emitting type displays, a state where the individual pixels do not emit any light is a state of darkness. Therefore, it is possible to obtain an ideal state of darkness easily, so that it is easy to improve the contrast.

(3) Viewing Angle Dependence

In the LCD, because the liquid crystal molecule has a double refractivity, and transmission and cutting off of the light is controlled by controlling the arranging direction of the liquid crystal molecule, the LCD has viewing angle dependence. Therefore, in case of the LCD, the state of display changes, depending on the viewing direction. In contrast, in the spontaneous light emitting type display, such problem hardly occurs.

(4) Response Characteristic

The LCD controls the arranging direction of the liquid crystal molecule by utilizing the dielectric constant anisotropy of the liquid crystal molecule. Therefore, from the viewpoint of principle, the time of response to the electric signal becomes 1 millisecond or more. For this reason, when displaying motion pictures, an after image may occur.

In contrast, in the spontaneous light emitting type display, the on/off of the pixel is controlled by utilizing the carrier transition, electron emission, plasma discharge, etc. Therefore, the response time to the electric signal is as short as the nanosecond level and, therefore, displaying motion pictures do not cause the occurrence of an afterimage.

Even among the spontaneous light emitting type displays having the above mentioned advantages, the organic EL display which uses the organic EL element (also called "the organic light-emitting diode") as the pixel has a practically extremely excellent feature that the driving (light emitting) voltage is low. Actually, the light emitting starting voltage of the organic EL element is 10 V or less, namely, compared to the light emitting element that is used in other spontaneous light emitting type displays, the driving voltage is extremely low. The organic EL display, having a feature that low voltage driving is possible, is suitable as, for example, a display for a battery driven type portable electronic device which the upper limit of power source voltage is limited. For this reason, nowadays, investigations of the organic EL displays have vigorously been made.

The basic structure of the organic EL element is the structure in which a light emitting layer formed from organic material is sandwiched in between an anode and a cathode. As necessity, in between the anode and the light emitting layer, a hole injection layer or hole transportation layer is formed, while, in between the cathode and the light emitting layer, an electron injection layer or electron transportation layer is formed. Also, the color of light emission is controlled by doping fluorescent dye or the like on the light emitting layer.

Here, in this specification, in a current driven type light emitting element, all layers that are formed in between the cathode and the anode are named generically as "light emitting portion". Also, in a case where the current driven type light emitting element is an organic EL element, that light emitting portion is referred to as "organic EL layer" in particular. The organic EL layer includes the hole injection layer, hole transportation layer, light emitting layer, electron transportation layer, and electron injection layer.

FIGS. 6 and 7 schematically illustrate sectional structures of the organic EL element. An organic EL element 30 illustrated in FIG. 6 is manufactured by forming a first electrode layer 33 on an electrically insulative substrate 1 having light transmittance such as a glass substrate or a plastic substrate, and forming an organic EL layer 35 and second electrode layer 37 sequentially thereon.

This organic EL element 30 is of a type in which the light emission El from the organic EL layer 35 is taken out from the electrically insulative substrate 1 side and is sometimes called "a bottom emitting type". In general, the first electrode layer 33 is used as an anode and the second electrode layer 37 is used as a cathode. The second electrode layer 37 is a non-light transmitting electrode formed of metal, in many cases.

An organic EL element 40 illustrated in FIG. 7 is manufactured by forming an electrode 43 on the electrically insulative substrate 1, and forming an organic EL layer 45 and a light transmitting second electrode layer 47 sequentially thereon.

This organic EL element 40 is of a type in which the light emission E2 from the organic EL layer 45 is taken out from the side opposite of the electrically insulative substrate 1, and in some cases is called "a top emitting type". Preferably, at least one of the electrically insulative substrate 1 or electrode 43 is non-light transmitting. In many cases, the electrode 43 is a non-light transmitting electrode that is formed of metal.

As the organic EL layers 35 and 45, in a case where low molecular weight material is used as the material of organic EL layers 35 and 45, the layers are generally formed by a vacuum deposition method. In a case where high molecular weight material is used, the layer is formed by a spin-coating method, printing method, or transfer method, by making the material into a solution. In a case where a large number of the organic EL layers 35 or 45 are formed at one time as when forming the pixels of the display, when low molecular weight material is used as a material of the individual organic EL layer 35 or 45, a mask deposition method for example is applied when high molecular weight material is used, an ink jet method, printing method, or transfer method is applied. In recent years, the availability of a coatable low molecular weight material has been reported.

In the organic EL elements 30 and 40, light is emitted by applying voltage in between the electrodes (between the anode and the cathode) and therefore current flow is applied through the organic EL layer 35 or 45. Conventionally, only fluorescence emission, which occurs when returning from a singlet excited state to a ground state, was utilized. As a result of recent studies, phosphorescence emission which occurs when returning from a triplet excited state to a ground state can be utilized. Thereby, the light emitting efficiency is improved.

Although not illustrated in FIGS. 6 and 7, in general, since the properties of the organic EL element 30 and 40 are significantly deteriorated by water or oxygen, the reliability is ensured by so-called "sealing". Sealing of the organic EL element 30 or 40 is performed, for example, by forming a space, in which the organic EL element 30 or 40 is accommodated, by using the electrically insulative substrate 1 and another substrate such that the organic EL element 30 or 40 does not contact to water or oxygen, and filling an inert gas into the space, or by covering the organic EL element 30 or 40 with a deposited thin film.

By using the organic EL elements 30 or 40 as the pixels, it is possible to obtain a full color display. The method for full colorizing includes: a three-color juxtaposition method of precisely disposing each organic EL element whose light emitting colors are red, green, and blue, per each pixel of the display; a CF method of combining the organic EL element, whose light emitting color is white, with primary-color (red, green, and blue) color filters (CF); and a CCM (Color Changing Medium) method of combining the organic EL element, whose light emitting color is blue, with red and green fluorescence converting dye filters.

The display which uses the organic EL element 30 or 40 as the pixel can roughly be classified, according to their driving methods, into a passive matrix type and an active matrix type, as in the case of the LCD.

In the passive-matrix type display, when disposing a large number of the organic EL elements 30 or organic EL elements 40 in the a matrix form, one piece of the first electrode layer 33 or electrode 43 is formed, for example, per each element row. Also, one piece of the second electrode layer 37 or 47 is formed per each element column. Further, at each of the intersection parts of the electrodes, as viewed from above, the organic EL layer 35 or 45, sandwiched by the first electrode layer 33 or electrode 43 and the second electrode layer 37 or 47, is formed.

This type of display has a merit that the structure is simple. However, for displaying an image by a time-divisional scan, the type has a demerit that, compared to the active matrix type display, it is necessary to increase the instantaneous brightness of the individual organic EL element 30 or 40 by the by multiple of the number of the scanning lines. For example, for obtaining the display whose resolution is VGA (Video Graphics Array) or more, the instantaneous brightness of the individual organic EL element 30 or 40 is desired to be 1000 cd/m$^2$ or more.

On the other hand, in the active matrix type display, for example, one first electrode layer 33 or electrode 43 is formed per each individual organic EL element 30 or 40, and one large-sized electrically conductive film is formed, as the second electrode layer 37 or 47, common to all the organic EL elements 30 or 40. Also, for controlling the operations of the organic EL elements 30 or 40, one switching circuit portion is disposed per each individual organic EL element 30 or 40. Each switching circuit portion is constituted of, for example, a plurality of semiconductor switching elements, and controls the operation of the organic EL element 30 or 40 corresponding to the switching circuit part, according to the pixel selecting signal supplied from the scanning line disposed per element row and to the image signal supplied from the data line disposed per element column.

Although this type of display has complex structure, compared to the passive-matrix type display, it has a lot of merits such as that the brightness of the light emitting from the individual organic EL element 30 or 40 is not needed to be very high, that the power consumption can be suppressed, and that the crosstalk between the pixels is unlikely to occur.

Further, by using a polycrystalline silicon (polysilicon) film or continuous grain boundary silicon (CG silicon) film for forming the semiconductor switching element, since the charge mobility is higher in those films than in the amorphous silicon film, forming of a high operating speed switching element is possible. As a result of this, it becomes easy to form various kinds of control circuits on a single substrate together with the pixels, thereby making the display small in size, low in cost, multi-functional, etc. Also, since the semiconductor switching element formed by using a polycrystalline film or continuous grain-boundary silicon film enables processing of a large current, it is suitable for controlling driving of the organic EL element which is a current driven type element.

When constituting the pixels in the active matrix type display by the top emitting type organic EL element 40, since the light emitting area rate is not limited by the circuit components such as the switching circuit portion, the bus lines, etc., more multi-functional and more complex circuits become easy to be form on the electrically insulative substrate 1.

FIG. 8 illustrates a constitution example of the pixel circuit in the active matrix type display 100 which uses the organic EL elements 30 as the pixels.

As illustrated in the figure, in the display 100, a large number of the organic EL elements 30 are disposed in the a matrix form. One piece of scanning line 11 is disposed per each element row along the element row, while one piece of data line 13 and power source supply line 17 are disposed per each element column along the element column.

In the actual display 100, the scanning line 11 is located, when viewed from above, in between two adjacent element rows, while the data line 13 and power source supply line 17 are located, when viewed from above, in between two adjacent element columns.

One switching circuit portion 20 per each individual organic EL element 30 is connected. The illustrated switching circuit portion 20 is constituted by the first thin film transistor 21, second thin film transistor 25, and gate retention capacitor 29 connected to the first thin film transistor 21 and second thin film transistor 25. The gate retention capacitor 29 is also connected to the power source supply line 17.

The gate of the first thin film transistor 21 and the scanning line 11 corresponding to the switching circuit portion 20 including the first thin film transistor 21 are electrically connected to each other. The source of the first thin film transistor 21 is electrically connected to the data line 13 and the drain thereof is electrically connected to the gate retention capacitor 29. Also, the gate of the second thin film transistor 25 is electrically connected to a wiring 23d which connects the first thin film transistor 21 corresponding to the second thin film transistor 25 and the gate retention capacitor 29, while the source of the second thin film transistor 25 is electrically connected to the power source supply line 17 and the drain thereof is electrically connected to the organic EL element 30.

When supplying a pixel selecting signal to prescribed scanning lines 11, the gate of each first thin film transistor 21 connected to the scanning lines 11 becomes open. Also, when supplying an image signal to prescribed data lines 13, the gate of the second thin film transistor 25, corresponding to the first thin film transistor 21 whose gate was opened by the above mentioned pixel selecting signal, becomes analogously open depending on the level of the above mentioned image signal. The opening degree of the gate of the second thin film transistor 25 is maintained by the gate retention capacitor 29 corresponding to the second thin film transistor 25. In that state, when voltage is applied to the power source supply line 17, to the organic EL element 30 connected to the second thin film transistor 25 whose gate is open, a value of current which corresponds the opening degree of the gate of the second thin film transistor 25 flows from the power source supply line 17. As a result, the organic EL element 30 emits light. That is, the organic EL element 30 emits light depending on the level of the above mentioned image signal.

Since the display 100 of the above mentioned constitution is an active matrix type, it has the above mentioned various merits. However, since in the display 100, the organic EL element is a current driven type light emitting element and the light emitting efficiency of the organic EL element is not very high, the driving thereof becomes difficult, when the definition is made higher, or the size is made larger.

While, as described above, the organic EL element can be driven with a low voltage, this means that if the light emitting efficiency is the same, a larger amount of driving current is necessary. The efficiency of the display can be expressed as the light emitting efficiency shown by the following formula.

The light emitting efficiency $(lm/W)$=brightness $(cd/m^2)$·$\pi/[$(voltage (V)·current density $(A/m^2))$ The display is demanded, in general, that it has a light emitting efficiency of 2 lm/w or more. For obtaining that light emitting efficiency in the organic EL display, it is necessary to obtain a brightness of approximately 100 $cd/m^2$ or more for each individual organic EL element. To that end, it is necessary that the current density in each organic EL element is 15 $A/m^2$ or more.

Compared to the current density of 1 to 2 $A/m^2$ in the pixel in other spontaneous light emitting type displays such as pixel in an inorganic EL display or pixel in a plasma display, the current density of 15 $A/m^2$ is an extremely high value. Since the LCD is a field driven type, when saying from the viewpoint of principle, there is almost no need to apply a flow of current to the individual pixels.

In the organic EL display, in order to supply a large current as mentioned above to the individual EL element, it is very important to lower the wring resistance of the power source supply line. If the wiring resistance is high, although it is possible to supply a sufficient amount of current to the organic EL element connected to the power source supply line on a near side of the power source supply terminal, it becomes impossible to supply, due to the voltage drop, a sufficient amount of current to the organic EL element connected to the power source supply line on a far side of the power source supply terminal. Resultantly, display unevenness occurs. The greater the number of pixels becomes, or the larger the size of the display screen becomes, the more important it becomes to lower the wiring resistance of the power source supply line.

For instance, Japanese Patent Application Laid-open No. 2002-32037 (reference 1) describes an organic EL display that has enabled supplying a large current to the individual organic EL element by disposing the power source supply line not only in between two adjacent element columns but also in between two adjacent element rows.

Also, Japanese Patent Application Laid-Open No. 2002-40961 (reference 2) describes an organic EL display in which the power source supply lines are collectively taken out around the substrate, while, Japanese Patent Application Laid-Open No. 2002-108262 (reference 3) describes an organic EL display in which the both ends of the power source supply lines are connected to the power source terminal. In the organic EL display described in both reference 2 and reference 3, the wiring resistance of the power source supply line is lowered by making the substantial length of the power source supply line, with respect to the power source, shorter.

However, in all of the organic EL displays described in the reference 1 to 3, in respect of making a higher definition or larger display, the wiring resistance of the power source supply line is relatively high.

As the circuit constitution and driving method of the organic EL display, other than those mentioned above, the apparatus in which the number of the thin film transistors in the individual switching circuit portion are made still larger (refer to "Pixel-Driving Methods for Large-sized Poly-SiAm-OLED Displays" by Yumoto et al, Asia Display/IDW' 01, P. 1395–1398. ) and the apparatus in which digital gradations are made (refer to "6-bit Digital VGA OLED" by Mizukami, SID' 00, P. 912–915. and "Full Color Displays Fabricated by Ink-Jet Printing" by Miyashita, Asia Display/IDW' 01, P. 1399–1402) are known. However, in all of those apparatuses, in respect of making a higher definition or larger displays the wiring resistance of the power source supply line is relatively high.

SUMMARY OF THE INVENTION

The present invention has been made in view of the above mentioned circumstances and a main object is to provide a display that makes it easy to supply a large current to each pixel constituted by a current driven type light emitting element, and an electronic device equipped with the display.

In order to attain the above object, the present invention provides a display comprising: an electrically insulative substrate; a plural of current driven type light emitting elements arranged, on the electrically insulative substrate, in a matrix form; a scanning line which is disposed at least one piece per each element row; a data line which is disposed at least one piece per one or two element columns; a power source supply line disposed on the electrically insulative substrate; and a switching circuit portion which is disposed at least one piece per at least one current driven type light emitting element, and can control electrical conduction between the current driven type light emitting element and the power source supply line according to a pixel selecting signal supplied to the scanning line and to a pixel signal supplied to the data line: wherein the switching circuit portion includes a plurality of switching elements; wherein the each current driven type light emitting element comprises: a first electrode layer disposed on the surface of a protective layer formed on the electrically insulative substrate; a light emitting portion laminated on the first electrode layer; and a second electrode layer formed on the light emitting portion: and wherein the power source supply line is buried within the protective layer.

In the present invention, since the power source supply line is disposed by being buried within the protective layer, the film thickness thereof is not limited by the switching circuit portion. Therefore, the degree of freedom of the power source supply film thickness is widened, so that the film thickness can be formed thicker than in the prior art. As a result, an effect of suppressing the rise of the wiring resistance is obtained, and even when the length of the wiring of the power source supply line is increased, it is possible to maintain the wiring resistance of the power source supply line to be at a small value. Accordingly, in respect of making a higher definition or a larger display, it becomes easy to supply a large current to each current driven type light emitting element. In consequence, it is possible to solve the inconveniences such as the decrease in brightness due to the wiring resistance of the power source supply line and to the resulting decrease of the current flow to the current driven type light emitting element, or the brightness unevenness of the display screen due to the increase of the wiring resistance of the power source supply line extending from the bias voltage source to each pixel.

In the above mentioned invention, it is preferable that the power source supply line is provided within a through-hole which is formed so as to pass through the protective layer from lower surface to upper surface. Among them, it is preferable that the power source supply line is provided so as an upper surface of the protective layer and an upper surface of the power source supply line are made flush with each other. The reason for this is as follows. That is, in the power source supply line disposed so as to be buried within the protective layer, if the upper surface of the protective layer and the upper surface of the power source supply line are made flush with each other, it is possible to ensure a sufficient value of thickness to make the wiring resistance small.

In the above mentioned invention, it is preferable that an insulating layer is provided so as to cover the upper surface of the power source supply line. By providing the insulating layer like that, it is possible to protect the power source supply line from separation as well as against the air and water. Therefore, the deterioration can be decreased even in a long time use.

In the above mentioned invention, it is preferable that the current driven type light emitting element is an EL element. The EL element is low in its driving voltage. By using the EL element, therefore, it becomes easy to obtain a display that is suitable as a display for a battery-driven type portable electronic device whose upper limit of power source voltage is limited. Also, even for obtaining a display driven by a commercial power source, since the driving voltage of the organic EL element is low, a constitution of a power source circuit for obtaining the desired power source voltage within the display will become simple.

Also, the present invention provides an electronic device equipped with the above mentioned display.

In the present invention, the display is a spontaneous light emitting type display which uses the current driven type light emitting element. Therefore, by using the display as a display of an electronic device, it is possible to decrease the power consumption of the electronic device compared to the case where a light receiving type display is used.

Further, the present invention provides a method for manufacturing a display, comprising: a process of forming a switching circuit portion on an electrically insulative substrate; a process of forming a protective layer, on the electrically insulative substrate with the switching circuit portion, so as to cover the switching circuit portion; a process of forming a through-hole in the protective layer so as to pass through the protective layer from a upper surface to a lower surface at a region which a power source supply line of the switching circuit portion is disposed; a process of forming the power source supply line so as to fill the through-hole; and a process of forming an insulating layer so as to cover the upper surface of the power source supply line disposed within the protective layer.

In the present invention, by manufacturing the display using the above mentioned manufacturing method, even when the number of pixels is increased, the wiring resistance is maintained at a small value. In consequence, it is possible to obtain a display which inconveniences, such as the decrease in brightness due to the wiring resistance of the power source supply line and to the resulting decrease of the current flow to the light emitting element, or the brightness unevenness of the display screen due to the increase of the wiring resistance of the power source supply line extending from the bias voltage source to each pixel, is improved.

In the above mentioned invention, it is preferable that the power source supply line is formed by a plating method. This is because the power source supply line can be filled into the through-hole with high reliability.

According to the present invention, the power source supply line is disposed by being buried into the protective layer. Therefore, its thickness is not limited by the switching circuit portion. This enables to increase the degree of freedom of the film thickness of the power source supply line, and also enables to make the thickness greater than that in the prior art. As a result of this, the effect of suppressing the rise of the wiring resistance is obtained and, even in a case where the length of the wiring of the power source supply line is increased, it is possible to maintain the wiring resistance of the power source supply line at a small value. Accordingly, in respect of making a higher definition or larger display, it becomes easy to supply a large current to each current driven type light emitting element. This brings about the effect of eliminating the inconveniences, such as the decrease in brightness due to the decrease in the amount of current flowing into the current driven type light emitting element that occurs due to the wiring resistance of the power source supply line, or the unevenness of the brightness on the display screen due to the increase in the wiring resistance of the power source supply line extending from a bias power source to each pixel.

DESCRIPTION OF THE PREFERRED EMBODIMENTS

Hereinafter, a display and a method for manufacturing the display in the present invention will be described.

1. Display

First, an embodiment of a display in the present invention will be explained using the drawings.

As stated previously, the display of the present invention is provided with an electrically insulative substrate, a current driven type light emitting element, a scanning line, a data line, a power source supply line, and a switching circuit portion. Hereinafter, an embodiment of the display in the present invention in a case where an organic EL element 30 of a type illustrated in FIG. 6 is used as a current driven type light emitting element will be explained using the drawings.

Figure 1:
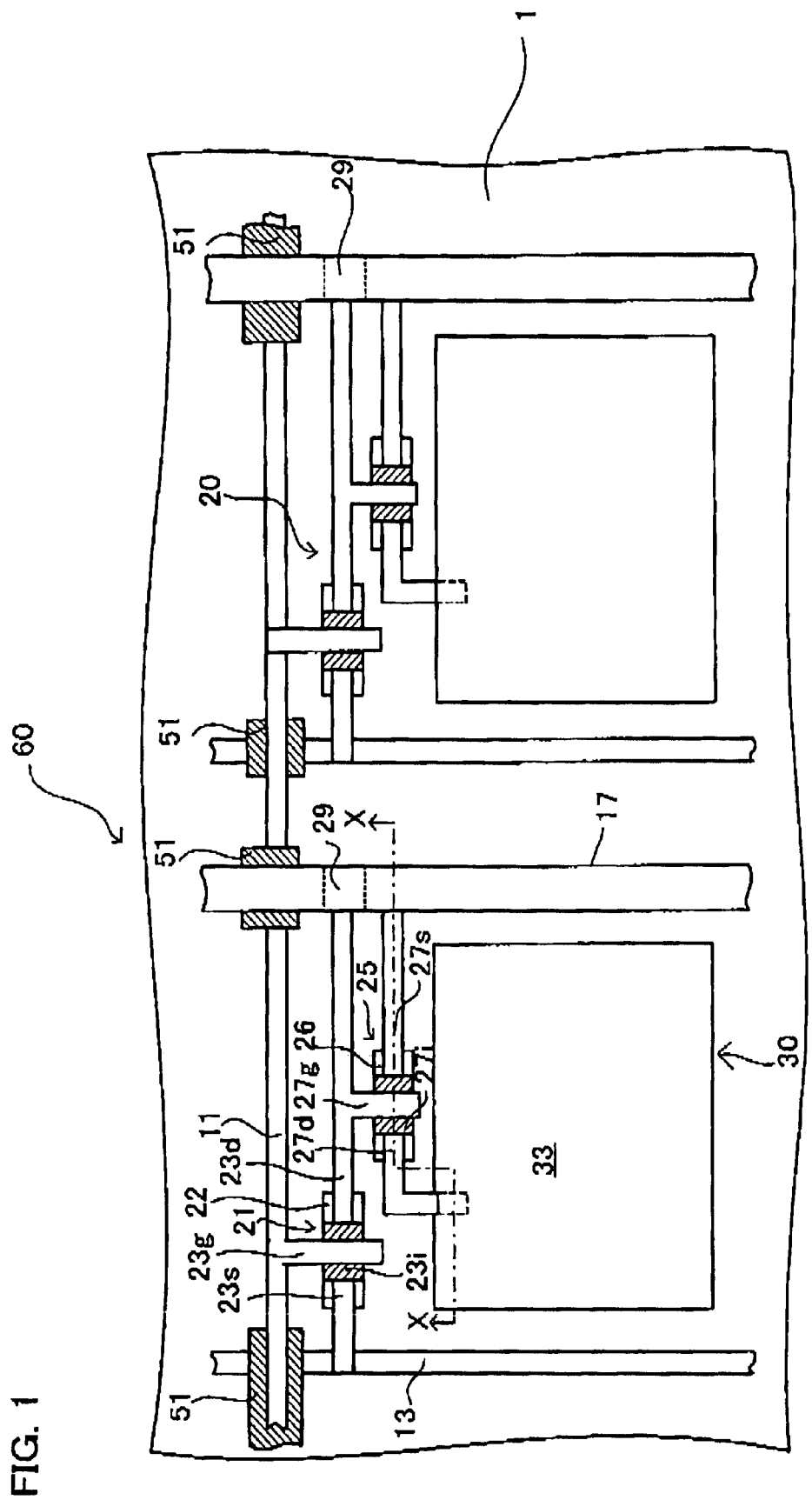
FIG. 1 is a schematic view illustrating a plan disposition, of a scanning line, data line, power source supply line, switching circuit portion, and first electrode layer constituting an organic EL element, in a display in the present invention.

FIG. 1 schematically illustrates the plan disposition of a scanning line, data line, power source supply line, switching circuit portion, and first electrode layer constituting an organic EL element, in the display in the present invention. Also, FIG. 2 schematically illustrates a sectional view of a line X—X illustrated in FIG. 1.

Figure 6:
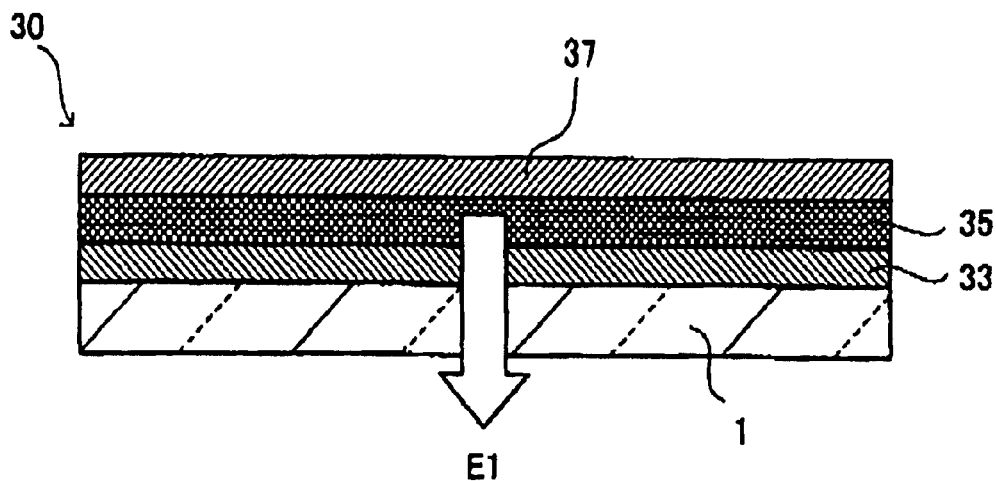
FIG. 6 is a schematic sectional view illustrating an example of the organic EL element.
Figure 7:
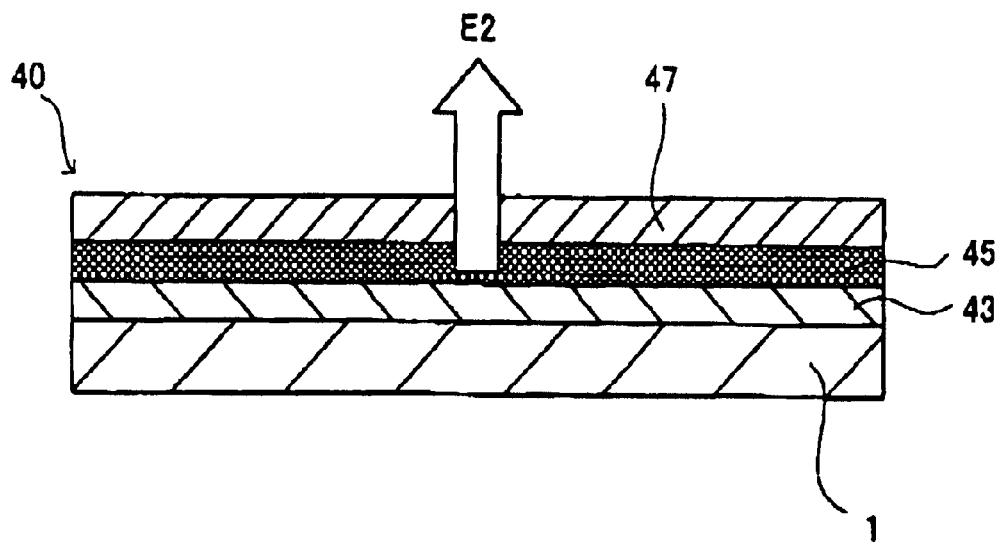
FIG. 7 is a schematic sectional view illustrating another example of the organic EL element.
Figure 8:
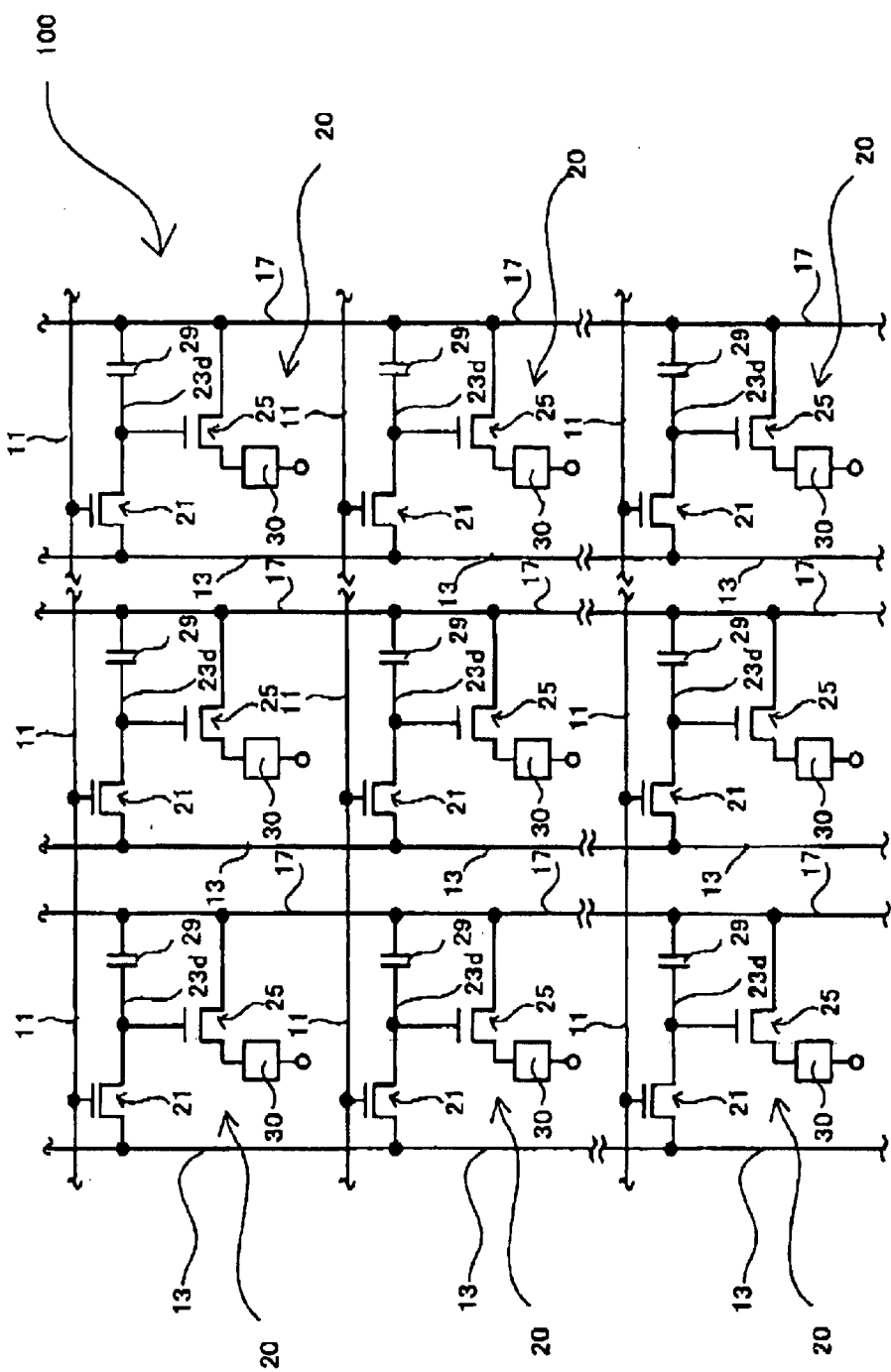
FIG. 8 is an equivalent circuit diagram illustrating an example of a conventional organic EL display.

Of the components illustrated in those figures, the components that are functionally common to those illustrated in FIG. 6 or FIG. 8 are denoted by reference symbols that are the same as those used in FIG. 6 or FIG. 8 and relevant explanation to them is omitted.

Figure 2:
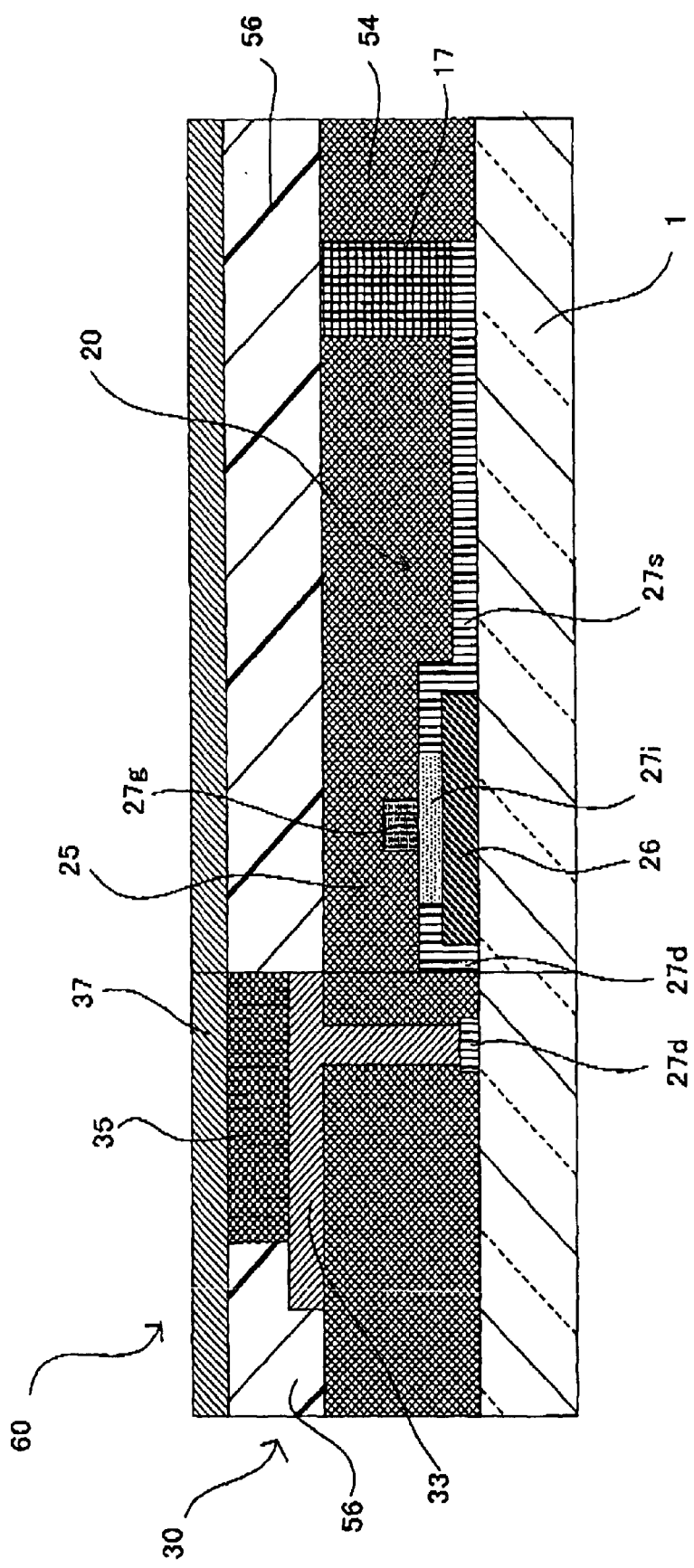
FIG. 2 is a schematic sectional view at a sectional line X—X illustrated in FIG. 1.

In a display 60 illustrated in FIGS. 1 and 2, a scanning line 11, data line 13, power source supply line 17, switching circuit portion 20, and organic EL element 30 are disposed on one surface of an electrically insulative substrate 1 having light transmittance.

The scanning line 11 is formed so as to be located under the power source supply line 17 and on the data line 13 via an electrically insulative film 51 formed in a prescribed area that is under the power source supply line 17 and on the data line 13. The data line 13 is formed under the scanning line 11 via the electrically insulative film 51 so as to cross the scanning line 11.

The switching circuit portion 20 is constituted by a first thin film transistor 21, second thin film transistor 25, and gate retention capacitor 29.

The first thin film transistor 21 has a semiconductor layer 22 formed on the above mentioned one surface of the electrically insulative substrate 1. A channel region, source region, and drain region are formed in this semiconductor layer 22. A gate insulative film 23*i* is formed on the channel region of the first thin film transistor 21.

One end of a wiring 23g is disposed on the gate insulative film 23*i*, and the other end of the wiring 23g is connected to the scanning line 11. The region of the wiring 23g, which is located on the gate insulative film 23*i*, functions as the gate electrode of the first thin film transistor 21. The source region of the semiconductor layer 22 is electrically connected to the data line 13 by a wiring 23s, and the drain region is electrically connected to the gate retention capacitor 29 by a wiring 23d.

As in the case of the first thin film transistor 21, the second thin film transistor 25 has a semiconductor layer 26 formed on the above mentioned one surface of the electrically insulative substrate 1. A channel region, source region, and drain region are formed in this semiconductor layer 26 as well. A gate insulative film 27*i* is formed on the channel region of the second thin film transistor 25.

One end of a wiring 27g is disposed on a gate insulative film 27*i*, while the other end of the wiring 27g is connected to a wiring 23d. The region of the wiring 27g, which is located on the gate insulative film 27*i*, functions as the gate electrode of the second thin film transistor 25. The source region of the semiconductor layer 26 is electrically connected to the power source supply line 17 by a wiring 27s, while the drain region is electrically connected to a first electrode layer 33 via a wiring 27d.

The above mentioned scanning line 11, data line 13, power source supply line 17, switching circuit portion 20, and electrically insulative film 51, as illustrated in FIG. 2, are covered by a protective film 54 formed with, for example, photo-sensitive polyimide. The upper surface of the protective film 54 is made flat, and on the upper surface, a light transmitting first electrode layer 33 is formed. The first electrode layer 33 and the above mentioned wiring 27d are electrically connected to each other by forming a part of the first electrode layer 33 within a through-hole formed at a prescribed portion of the protective film 54.

Figure 3:
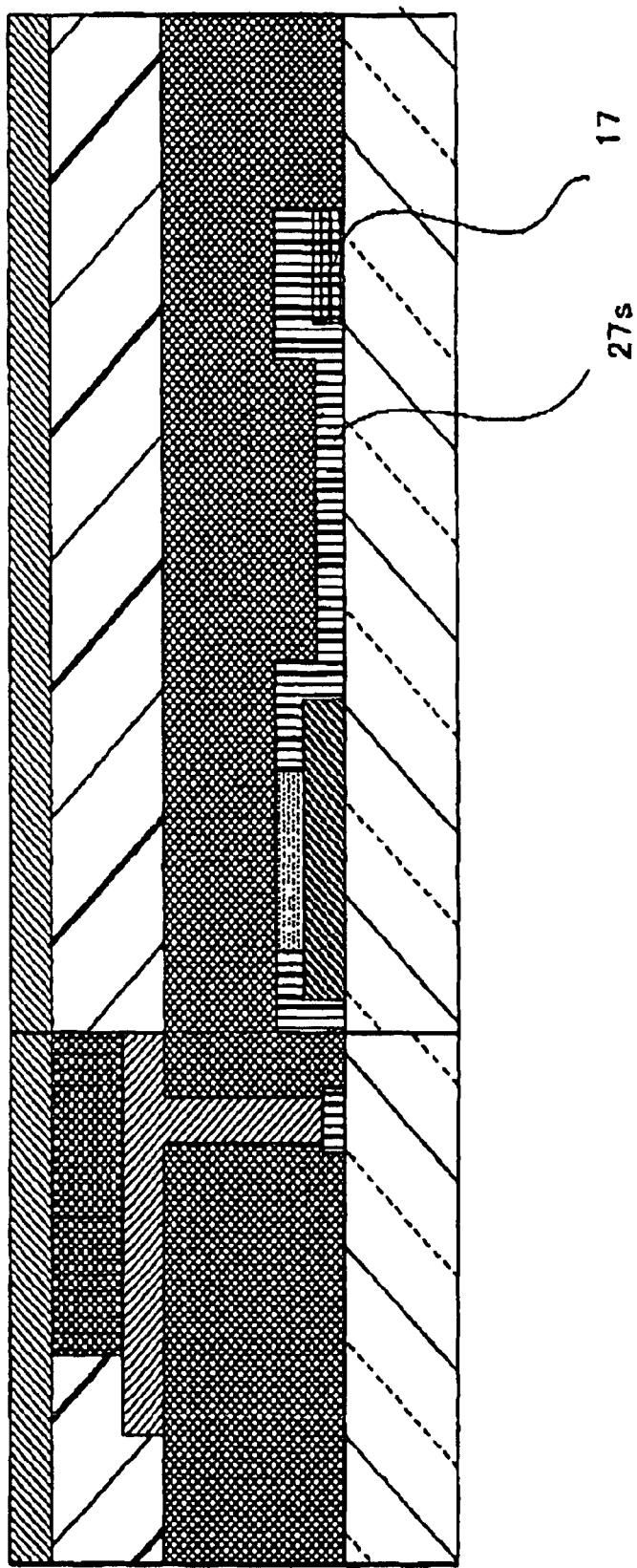
FIG. 3 is a schematic sectional view illustrating an example of a conventional display at the position which corresponds to the line X—X illustrated in FIG. 1.

In the present invention, the power source supply line 17 is disposed so as to be buried within the protective layer 54. That is, as illustrated in FIG. 2, the power source supply line 17 is located on the wiring 27s and gate retention capacitor 29 (not illustrated). Conventionally, as illustrated in FIG. 3, the power source supply line 17 was disposed under the wiring 27s. Accordingly, the thickness of the power source supply line 17 is limited by the wiring 27s and gate retention capacitor 29 (not illustrated) that are located on it, and it was difficult to ensure a sufficient value of thickness. However, in the present invention, as illustrated in FIG. 2, the power source supply line 17 is disposed so as to be buried within the protective layer 54. Therefore, that upper surface is not limited, as in the prior art, by the wiring 27s or the like, therefore it is possible to increase the degree of freedom of the film thickness of the power source supply line 17. As a result of this, it is possible to form the film thickness thicker than in the prior art and it becomes possible to suppress the increase of the wiring resistance. In addition, by making the upper surface of the power source supply line 17 at the same level as the upper surface of the protective layer 54, it is possible to make the film thickness of the power source supply line 17 thicker to a maximum value which is disposed within the protective layer 54. It is therefore possible to enhance the effect of suppressing the increase of the wiring resistance a lot more.

As illustrated in FIG. 2, the first electrode layer 33 is covered by an insulating layer 56, whereby the effect due to the concentration of electric charges at the end portion of the first electrode layer 33 is avoided. Further, in the present invention, by forming that insulating layer 56 so as to cover the upper surface of the power source supply line 17, this power source supply line 17 is protected from being separated or protected against the effect of water and oxygen.

Also, an organic EL layer 35 is formed on the first electrode layer 33. On the organic EL layer 35, a second electrode layer 37 which is a facing electrode of the first electrode layer 33 is formed. Also, in order to seal the organic EL element 30, by providing a barrier layer or the like on the second electrode layer 37, it is possible to protect the organic EL element itself against the effect of oxygen, water, etc. and thereby to extend the service life of that element.

In the display that is formed with the above mentioned constitution, as stated above, the power source supply line is disposed so as to be buried within the protective layer. Therefore, even in a case where making a higher definition or larger display, it is possible to decrease the wiring resistance of the power source supply line, and to that extent, it becomes possible to supply a large current to each organic EL element more easily. If it is possible to supply a large current to the individual organic EL elements, it is possible to increase the brightness of each organic EL element. Further, since, as a result of this, the width of the gradations, the color range, etc. that are reproducible are made wider, it is easy to improve the quality of the display.

Hereinafter, the display of the present invention will be explained by each component.

(1) Power Source Supply Line

The power source supply line is for the purpose of supplying a driving current to each current driven type light emitting element, and in the present invention, it is disposed so as to be buried within the protective layer.

By disposing the power source supply line in that way, the film thickness thereof is not limited by the electrodes, etc. constituting the switching circuit portion. Therefore, the degree of freedom of the film thickness is increased and it is possible to form the film thickness thicker. Accordingly, even in a case where the number of pixels is increased and the length of the wiring of the power source supply line is increased, it is possible to maintain the wiring resistance of the power source supply line to be at a small level. Therefore, it becomes possible to supply a large current easily to each current driven type light emitting element such as the organic EL element.

As the above mentioned power source supply line, it is not particularly limited as long as it is electrically connected to the switching circuit portion and is disposed so as to be buried within the protective layer. However, it is preferable that the power source supply line is provided within a through-hole formed in the protective layer. Further, it is preferable that the power source supply line is formed so that the upper surface of the protective layer and that of the power source supply line are at the same level. This is because ensuring a sufficient value of thickness becomes possible and the effect of maintaining the wiring resistance to be at a small value is sufficiently obtained.

Incidentally, the word "through-hole" referred to here means a groove provided so as to pass through the protective layer from the upper surface to the lower surface.

Also, as the film thickness of the power source supply line, it is not particularly limited as long as it enables to maintain the resistance of the wiring at a small level. However, specifically, it is preferable that the film thickness is in a range of 0.5 $\mu$m to 10 $\mu$m, or more preferably, in a range of 2 $\mu$m to 5 $\mu$m.

As the material for forming the above mentioned power source supply line, it is not particularly limited as long as the power source supply line is formed with electrically conductive material. Specifically, it is possible to list metals such as Cr, Ni, Au, Cu, Ag, Al, etc. Among the above, Al, Cu, and Ag are more preferable. This is because they are electrically highly conductive materials.

(2) Protective Layer

The protective layer is provided for protecting the switching circuit portion formed on the electrically insulative substrate, and also provided to maintain the flatness of the substrate.

As the material for forming the protective layer, photo-sensitive acrylic resin, photo-sensitive polyimide, etc. can be listed as the examples. Among the above, it is preferable that the material is photo-sensitive acrylic resin from the standpoint of workability and flatness required as a protective layer.

Also, as the film thickness of the protective layer, it is not particularly limited as long as it enables to maintain the flatness of the substrate. However, specifically, it is preferable that the film thickness is in a range of 0.5 $\mu$m to 10 $\mu$m, or more preferably, in a range of 2 $\mu$m to 5 $\mu$m. The reason for this is that, in the present invention, the power source supply line is disposed within the protective layer and, preferably, the upper surface of the protective layer and the upper surface of the power source supply line are made flush with each other. Therefore, by the protective layer being within the above mentioned range, it becomes possible to ensure the film thickness of the power source supply line sufficiently.

(3) Insulating Layer

Generally, the insulating layer is provided for the purpose of avoiding the effect due to the concentration of electric charges at the end portion of the first electrode layer. In the present invention, by forming the insulating layer so as to cover the upper surface of the above mentioned power source supply line, it is possible to protect that power source supply line from separation, as well as against the effect of water, oxygen, etc. As a result of this, it is possible to obtain a display having high reliability.

As is usually known, the above mentioned insulating layer can be pattern-formed by using, for example, a UV-curing resin material. Specifically, novolak resin, polyimide, etc. can be listed as the examples.

(4) Electrically Insulative Substrate

The electrically insulative substrate is for the purpose of mounting other components. As the electrically insulative substrate, for example, a glass substrate, glass film, synthetic resin substrate, synthetic resin film, etc can be used.

In a case where taking out the light emission from the current driven type light emitting element from the electrically insulative substrate side, as the electrically insulative substrate, the one that has light transmittance to the light emission can be used.

In a case where taking out the light emission from the below mentioned second electrode side, which constitutes the current driven type light emitting element, the electrically insulative substrate may have light transmittance to that light emission, or may not have light transmittance. However, in this case, it is preferable that the below mentioned power source supply line is non-light transmitting to the light emission.

(5) Current Driven Type Light Emitting Element

As the current driven type light emitting element, an EL element, LED (Light emitting Diode) element, etc can be used.

From the standpoint that driving at a low voltage is easy, as the current driven type light emitting element, the EL element is the most preferable.

(6) Scanning Line and Data Line

The scanning line is disposed at least one piece per each element row for the purpose of supplying a pixel selecting signal to each current driven type light emitting element by unit of an element row. The scanning line can be formed using electrically conductive material such as aluminium (Al), an alloy of aluminium and niobium (Nb), chromium (Cr), etc.

The data line is for the purpose of supplying an image signal to each current driven type light emitting element by unit of an element column, and it can be formed using electrically conductive material as in the case of the scanning line.

In a case where a large number of current driven type light emitting elements are disposed in the form of a square matrix (however, it includes a case where the number of rows and the number of columns are different from each other.), as in the case where the current driven type light emitting elements are disposed as a mosaic form, the data line is disposed at least one piece per each element column. On the other hand, in a case where a large number of current driven type light emitting elements are disposed so as the disposition of the current driven type light emitting element is shifted by substantially ½ pitch in one element row and in an element row adjacent thereto, as in the case where the current driven type light emitting elements are disposed as a triangle form, the data line can be disposed at least one piece per each two element columns.

It is to be noted that, in this specification, a large number of current driven type light emitting elements, which are disposed so as the disposition of the current driven type light emitting element is shifted by substantially ½ pitch in one element row and in an element row adjacent thereto, are included in "a large number of current driven type light emitting elements arranged in a matrix form".

(7) Switching Circuit Portion

The switching circuit portion is for the purpose of controlling the electrical conduction between the current driven type light emitting element and the power source supply line depending on the pixel selecting signal supplied to the scanning line and the image signal supplied to the data line.

This switching circuit portion can be constituted by using a semiconductor switching element such as a thin film transistor, diode, etc. For example, in a case where using a thin film transistor as the semiconductor switching element, it is preferable that the switching circuit portion is constituted by combining at least two thin film transistors. It is possible to make concurrent use of a gate retention capacitor for maintaining the degree of opening of the gate of a specific thin film transistor, as the occasion demands.

2. Method for Manufacturing a Display

Next, a method for manufacturing a display will be explained.

The method for manufacturing a display in the present invention comprises: a process of forming a switching circuit portion on an electrically insulative substrate; a process of forming a protective layer, on the electrically insulative substrate with the switching circuit portion, so as to cover the switching circuit portion; a process of forming a through-hole in the protective layer so as to pass through the protective layer from a upper surface to a lower surface at a region which a power source supply line of the switching circuit portion is disposed; a process of forming the power source supply line so as to fill the through-hole; and a process of forming an insulating layer so as to cover the upper surface of the power source supply line disposed within the protective layer.

In the present invention, by manufacturing the display such method for manufacturing, it is possible, even in a case where the number of the pixels is increased, to maintain the wiring resistance at a small value. This enables obtaining the display that has been improved in terms of the inconveniences, such as the decrease in the brightness due to that decrease in the current flowing through the light emitting element which occurs from the wiring resistance of the power source supply line, the unevenness in the brightness on the display screen due to the increase in the wiring resistance of the power source supply line, etc.

An embodiment of the above mentioned method for manufacturing a display in the present invention will concretely be explained using the drawings. FIGS. 4A, 4B, 4C, 4D, and 4E are process drawings illustrating an example of a method for manufacturing the display in the present invention.

Figure 4A:
FIGS. 4A, 4B, 4C, 4D, and 4E are process drawings illustrating an example of a method for manufacturing the display in the present invention.

First, as illustrated in FIG. 4A, the switching circuit 20 that has the above mentioned constitution is formed on the electrically insulative substrate 1. As the method for forming such switching circuit 20, it is possible to form by using a known forming method.

Figure 4B:
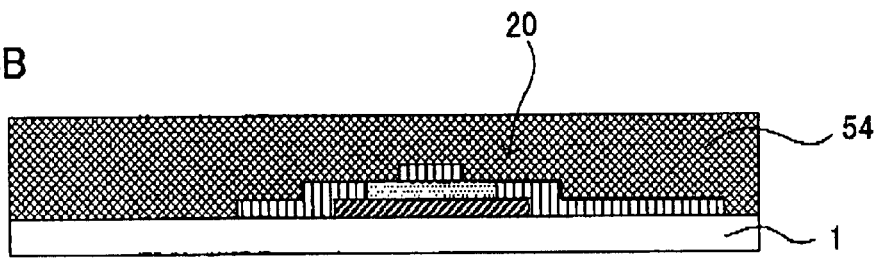

Next, on the electrically insulative substrate having the switching circuit 20 formed thereon, as illustrated in FIG. 4B, the protective layer 54, that protects the switching circuit 20 and keeps the flatness of the electrically insulative substrate 1, is formed. As the method for forming such protective layer 54, it can be formed by known coating methods that include a spin coating method, casting method, dipping method, bar coating method, blade coating method, roll coating method, gravure coating method, flexographic method, spray coating method, etc.

Figure 4C:
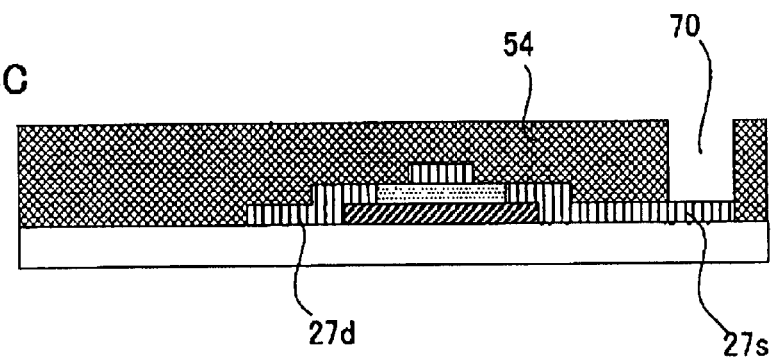

Subsequently, as illustrated in FIG. 4C, among the switching circuits 20 which are formed under the protective layer 54, a through-hole 70 is formed, at the protective layer 54 corresponding to the position which power source supply line 17 is formed, so as to pass through the protective layer 54 from the lower surface to the upper surface. As the forming method for forming the through-hole 70, it is not particularly limited as long as it enables to remove the protective layer 54 at the desired position. However, it is preferable to form by using a method such as photolithography. For example, by forming the protective layer 54 using photo-sensitive resin and exposing it to ultraviolet rays via a mask, it is possible to form the through-hole 70 highly precisely at a desired position without damaging the switching circuit 20.

Also, although not illustrated, when forming the through-hole 70, another through-hole may be formed simultaneously in the region where the first electrode layer and the switching circuit 20 are connected to each other, for example, on the wiring 27d of the second thin film transistor. As a result of that, when forming the first electrode layer on the protective layer 54, the switching circuit 20 and the current driven type light emitting element are electrically connected by forming so as to fill not only the protective layer 54 but also the other through-hole.

Figure 4D:
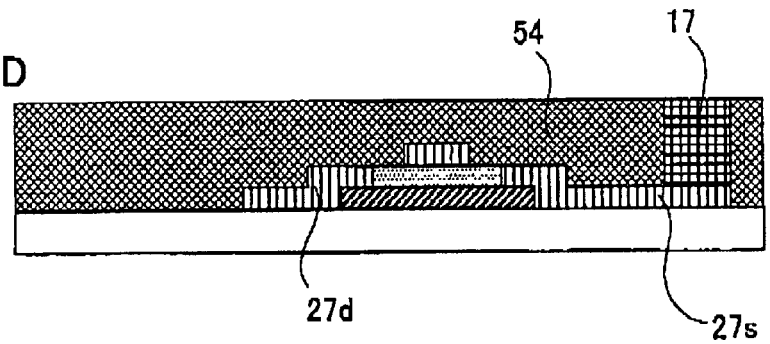

Further, as illustrated in FIG. 4D, the power source supply line 17 is disposed so as to fill the above mentioned through-hole 70. As the forming method for the power source supply line 17, it is not particularly limited as long as it enables to fill the through-hole 70. Specifically, the forming method such as a sputtering method, electron beam method, electrolytic plating method, electroless plating method, etc. can be listed. Among the above, plating method such as electrolytic plating method or electroless plating method is preferable. The reason for this is that the interior of the through-hole 70 can be filled with high reliability and a sufficiently thickness can be ensured for suppressing the rise in the resistance of the wiring.

Figure 4E:
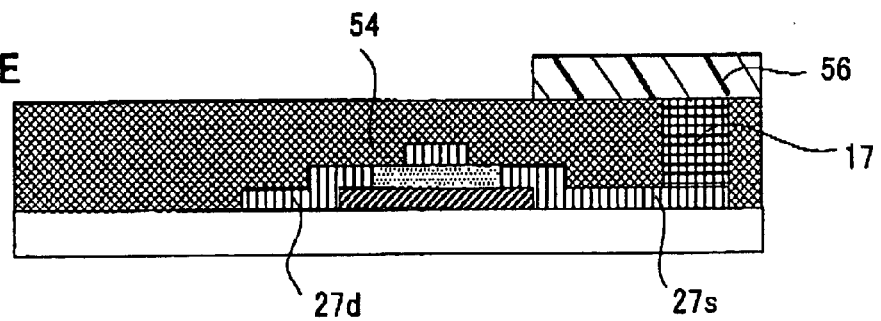

Further, as illustrated in FIG. 4E, the insulating layer 56 is formed so as to protect the upper surface of the power source supply line 17. Generally, the insulating layer 56 is provided for preventing the inconvenience that due to the concentration of electric charge at the end portion of the first electrode layer, insulation failure between the second electrode layer, that is an facing electrode to the first electrode layer, and the first electrode layer will occur. However, in the present invention, by forming the insulating layer 56 so as to cover the upper surface of the power source supply line 17 as well as the end portion of the first electrode portion, it is possible to protect the power source supply line 17 from separation and against the effect of oxygen, water, etc.

By finally forming the current driven type light emitting element on the first electrode layer, the display is manufactured. For instance, in the present invention, as the current driven type light emitting element, an EL element is preferable. That is, by forming an organic EL layer such as a light emitting portion on the first electrode layer, or an electric charge injection/transportation layer for stably injecting and transporting electric charges from the electrode into the light emitting portion, and further forming the second electrode layer as the facing electrode to the first electrode layer, it is possible to obtain an EL display.

3. Electronic Devices

The electronic devices of the present invention are the ones equipped with the above mentioned display of the present invention, as a display. The use purpose of that electronic device is basically of any kind if it can be loaded with the display.

Figure 5A:
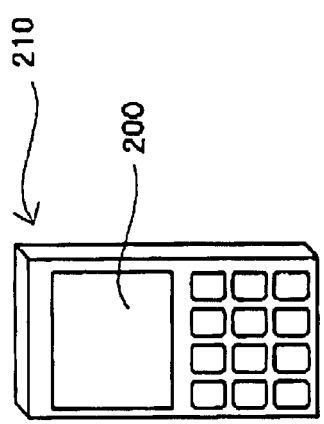
FIGS. 5A, 5B, 5C, and 5D are schematic views illustrating examples of electronic devices in the present invention.
Figure 5B:
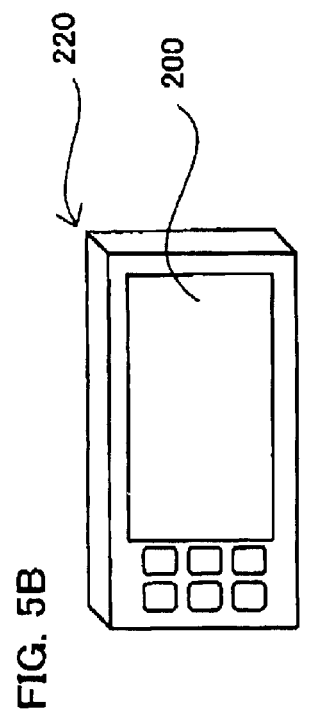
Figure 5C:
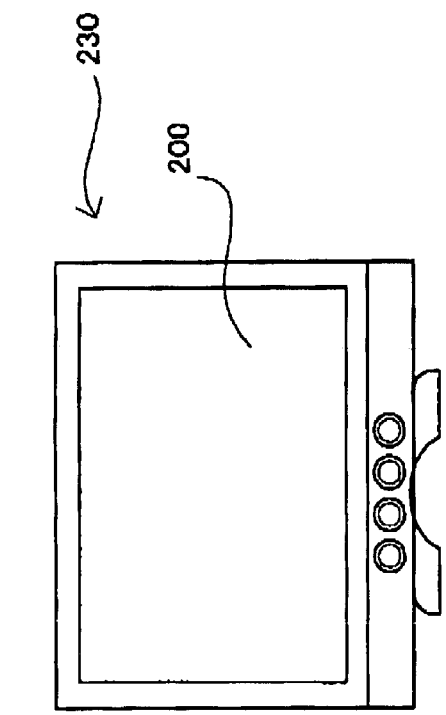
Figure 5D:
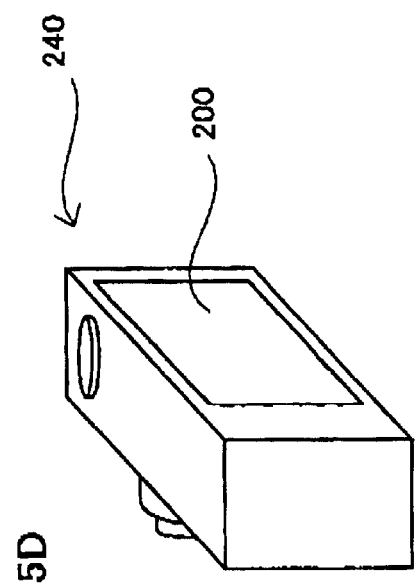

From the viewpoint of taking advantage of the features of the display in the present invention, electronic devices for use of which display is desired are particularly preferable, for example, a portable telephone 210 schematically illustrated in FIG. 5A, a portable terminal 220 schematically illustrated in FIG. 5B, a monitor 230 (display of TV receiver or computer, etc.) illustrated in FIG. 5C, a digital camera 240 schematically illustrated in FIG. 5D, etc. Incidentally, in FIGS. 5A to 5D, the display in the present invention is indicated by the reference symbol 200.

Incidentally, the present invention is not limited to the above mentioned embodiment. The above mentioned embodiment is only an example. Whatever having substantially the same configuration and bringing about the same operation effects as the technical thought described in claims of the present invention is incorporated in the technical range of the present invention.

EXAMPLES

Hereinafter, Examples are illustrated to give a further explanation of the present invention.

Example 1

As an example of the present invention, an active matrix organic EL display having a pixel circuit constitution illustrated in FIG. 8 was manufactured on a glass substrate by using a polysilicon film.

On a diagonal 17 inch substrate (size of 300 mm×370 mm), pixels were designed with a standard of XGA (768× 1024).

First, pixel TFT, driver TFT circuit, and bus lines such as scanning lines and data signal lines were formed on the substrate. Then, a protective layer was formed with photo-sensitive acrylic resin, and through-holes which connects a source electrode and drain electrode of the driving TFT was formed. The film thickness of the protective layer was made 4 $\mu$m.

An ITO electrode was formed such that it may be connected to the drain via the through-hole on the drain side, and patterning was done to the pixel form. For forming the ITO electrode, a sputtering method was used.

Subsequently, a power source supply line was formed so as to be connected to the source via the through-hole on the source electrode side. As a material for the power source supply line, Cu was used, and the power source supply line was formed by depositing Cu within the through-hole by electroless plating.

Further, the edge insulative film having a thickness of 1 $\mu$m was formed with a photo-sensitive resin.

On the active matrix substrate formed as the above, an organic EL element was laminated to manufacture a display.

As the organic EL element, regarding the light emitting layer, a hole injection layer TPD [N,N'-diphenyl-N,N'-bis (3-methyl-Phenyl)-1, 1-diphenyl-4,4'-diamine] and light emitting organic materials of each color were laminated. Thereafter, by a mask deposition method, three-color juxtaposition deposition was performed to form a sub-pixel. Thereby, a full color display was manufactured. As the G-light emitting material, Alq$_3$ [tris (8-hydroxyquinoline) aluminium] was used, as the B-light emitting material, DPVBi (1,4-bis (2,2-diphenylivinyl) biphenyl) was used, and, as the R-light emitting material, a material obtained by adding 1.0 wt % of DCM (dicyanomethylene pyran derivative) to Alq$_3$ was used.

As the anode, the above mentioned ITO was formed, and as the cathode, MgAg was formed. The laminating order of TPD and ITO was made so as the TPD and the ITO contact to each other. The TPD (m), refined with a subliming/refining device which was sufficiently preheated under high vacuum, was applied onto a tungsten board and was formed into a film of 50 nm thickness by a resistance heating method. Further, on the resulting substrate, the sublimed and refined Alq$_3$ was applied onto a quartz board and was formed into a film of 30 nm thickness by the resistance heating method. Finally, the MgAg alloy (Mg:Ag=10:1) was deposited so that the film thickness was 150 nm and, further, as the protective layer, Ag was deposited thereon so that the film thickness was 200 nm. Finally, the resulting substrate was sealed together with a glass substrate that had been separately prepared, by means of a UV curing sealing material, to obtain an organic EL display.

When the organic EL display formed as the above was driven by applying an image signal, an uniform image was displayed on the entire screen.

Comparative Example

As Comparative Example, except that the conventional linear power source supply line illustrated in FIG. 3 was formed, instead of the buried power source supply line in Example 1, an active matrix organic EL display was formed as the Example 1. When the organic EL display formed as the above was driven by applying an image signal, the brightness is deteriorated at the portion far from the power source input terminal, with the result that an uniform image could not be displayed.

Example 2

As another Example of the present invention, except that the low molecular weight organic EL material that was used in Example 1 was replaced by a high molecular weight organic EL material, the same processes as those in Example 1 were performed. By this, the same effect as the Example 1 was obtained.

As the hole injection layer, PEDOT (polythiophen: Bayer CH8000) was coated to a thickness of 80 nm by spin coating and was baked at 160° C. to form the layer. A solution obtained by dissolving the following high molecular weight organic EL material into a solvent and liquefying was applied onto the PEDOT, using an ink jetting method, to make the three colors being juxtaposed, while CaAg was deposited as the cathode. A full color display was obtained. (The Composition of the Organic EL Layer Forming Coating Solution)

| | |
|---|---|
| Polyvinyl carbazole | 70 weight part |
| Oxadiazole compound | 30 weight part |
| Coumarin 6 (fluorescent dye) | 1 weight part |
| Monochloro benzene (solvent) | 4900 weight part |

In the case where the fluorescent dye is coumarin 6, green light emission having a peak wavelength of 501 nm; in the case where the fluorescent dye is perylene, blue light emission having a peak wavelength of 460 to 470 nm; and in the case where the fluorescent dye is DCM, redlight emission having a peak wavelength of 570 nm was obtained. These were used as the light emitting materials for each color.

What is claimed is:

1. A display comprising: an electrically insulative substrate; a plurality of current driven type light emitting elements arranged, on the electrically insulative substrate, in a matrix form; a scanning line which is disposed at least one piece per each element row; a data line which is disposed at least one piece per one or two element columns; a power source supply line disposed on the electrically insulative substrate; and a switching circuit portion which is disposed at least one piece per at least one current driven type light emitting element, and can control electrical conduction between at least one of the current driven type light emitting elements and the power source supply line according to a pixel selecting signal supplied to the scanning line and to a pixel signal supplied to the data line, wherein the switching circuit portion includes a plurality of switching elements, wherein the each current driven type light emitting element comprises; a first electrode layer disposed on the surface of a protective layer formed on the electrically insulative substrate; a light emitting portion laminated on the first electrode layer; and a second electrode layer formed on the light emitting portion; and wherein the power source supply line is buried within the protective layer.

2. The display according to claim 1, wherein the power source supply line is provided with a through-hole which is formed so as to pass through the protective layer from lower surface to upper surface.

3. The display according to claim 1, wherein the power source supply line is provided so as an upper surface of the protective layer and an upper surface of the power source supply line are flush with each other.

4. The display according to claim 1 wherein an insulating layer is provided so as to cover the upper surface of the power source supply line.

5. The display according to claim 1, wherein the current driven type light emitting element is an electroluminescent element.

6. An electronic device comprising the display according claim 1.

7. A method for manufacturing a display, comprising:

forming a switching circuit portion on an electrically insulative substrate;

forming a protective layer, on the electrically insulative substrate with the switching circuit portion, so as to cover the switching circuit portion;

forming a through-hole in the protective layer so as to pass through the protective layer from a upper surface to a lower surface at a region which a power source supply line of the switching circuit portion is disposed;

forming the power source supply line so as to fill the through-hole; and forming an insulating layer so as to cover the upper surface of the power source supply line disposed within the protective layer.

8. The method for manufacturing a display according to claim 7, wherein the power source supply line is formed by a plating method.

* * * * *